United States Patent
Igarashi (10) Patent No.: US 7,560,346 B2
(45) Date of Patent: Jul. 14, 2009

(54) SEMICONDUCTOR DEVICE AND METHOD OF MANUFACTURING THE SAME

(75) Inventor: Takeshi Igarashi, Yamanashi (JP)

(73) Assignee: Eudyna Devices Inc., Yamanashi (JP)

(*) Notice: Subject to any disclaimer, the term of this patent is extended or adjusted under 35 U.S.C. 154(b) by 206 days.

(21) Appl. No.: 11/727,962

(22) Filed: Mar. 29, 2007

(65) Prior Publication Data

US 2007/0228424 A1 Oct. 4, 2007

(30) Foreign Application Priority Data

Mar. 31, 2006 (JP) ............................. 2006-101123

(51) Int. Cl.
*H01L 21/336* (2006.01)
*H01L 29/76* (2006.01)

(52) U.S. Cl. ...................... 438/283; 257/319

(58) Field of Classification Search .............. 257/250, 257/266, 278, 319; 438/258, 283
See application file for complete search history.

(56) References Cited

U.S. PATENT DOCUMENTS 5,701,107 A * 12/1997 Kasahara et al. ............ 333/164

7,417,275 B2 * 8/2008 Liu ............................. 257/308

FOREIGN PATENT DOCUMENTS

JP 2000-150536 A 5/2000

* cited by examiner

*Primary Examiner*—Calvin Lee
(74) *Attorney, Agent, or Firm*—Westerman, Hattori, Daniels & Adrian, LLP.

(57) ABSTRACT

A semiconductor device includes: a first FET that is formed with first unit FETs each having a first finger electrode and a second finger electrode provided on either side of a gate finger electrode, the first unit FETs being connected in parallel; and a second FET that is formed with second unit FETs each having a first finger electrode and a second finger electrode provided on either side of a gate finger electrode, the second unit FETs being connected in parallel. In this semiconductor device, the second finger electrode of each of the first unit FETs and the first finger electrode of each corresponding one of the second unit FETs form a common finger electrode, and the first finger electrodes of the first unit FETs, the second finger electrodes of the second unit FETs, and the common finger electrodes are arranged in the gate length direction of the first FET and the second FET.

10 Claims, 9 Drawing Sheets

GATE LENGTH DIRECTION

GATE LENGTH DIRECTION

GATE LENGTH DIRECTION

SEMICONDUCTOR DEVICE AND METHOD OF MANUFACTURING THE SAME

BACKGROUND OF THE INVENTION

1. Field of the Invention

The present invention generally relates to a semiconductor device and a method of manufacturing the semiconductor device, and more particularly, to a semiconductor device that has a source and a drain, and a method of manufacturing the semiconductor device.

2. Description of the Related Art

FETs (Field Effect Transistors) are used in various fields. In a horizontal FET that has source electrodes, gate electrodes, and drain electrodes formed on the same face of a semiconductor substrate, the source electrodes, the gate electrodes, and the drain electrodes are arranged on the surface of the substrate in the gate length direction (the current flowing direction) of the FET. In a case where a FET having a large gate width is to be formed, each electrode is formed with fingers, and the fingers are connected with bus lines.

Figure 1:
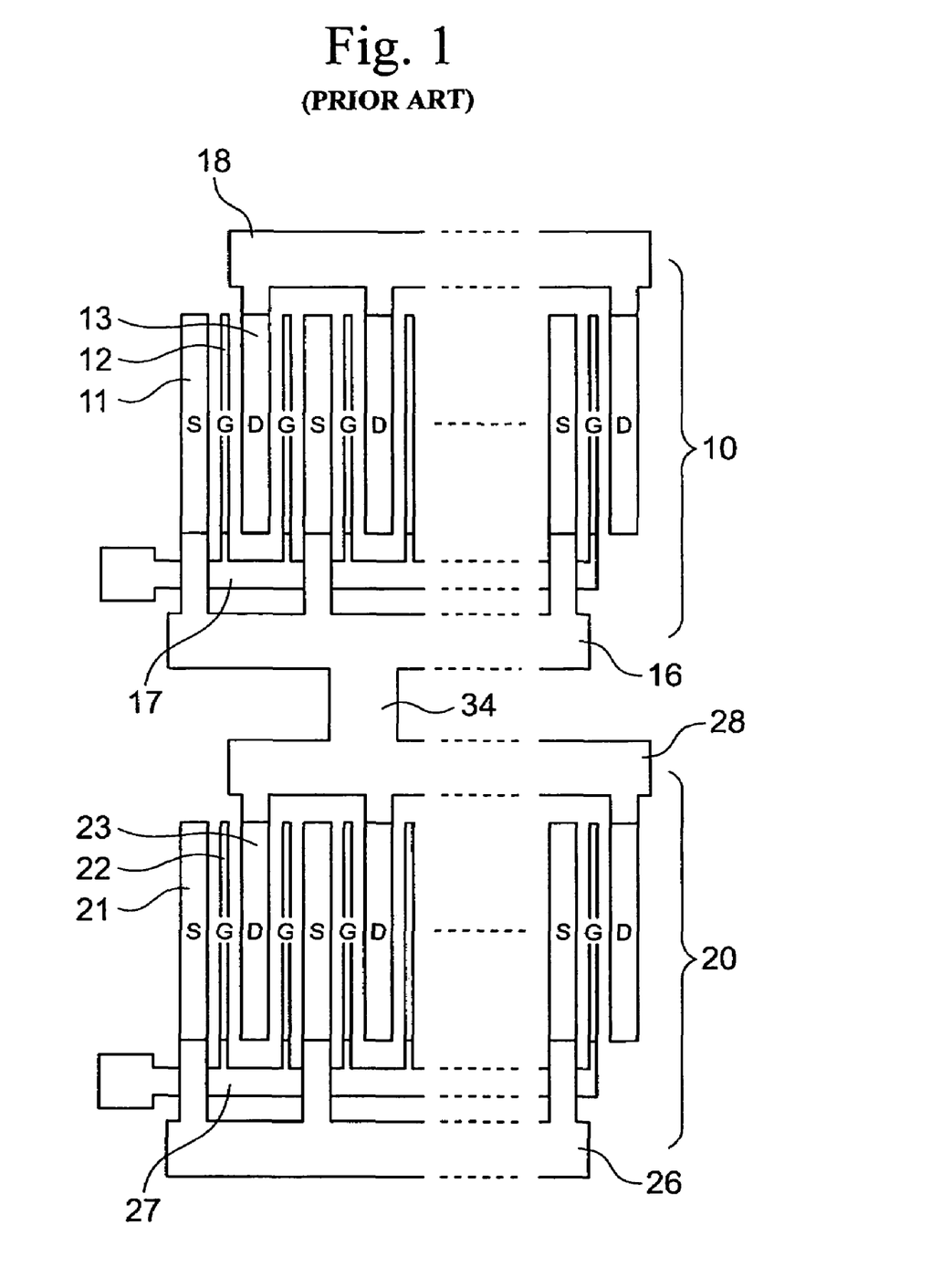
FIG. 1 is a plan view of a conventional semiconductor device.

FIG. 1 shows an example case where such FETs are cascade-connected (connected in series). A first FET 10 and a second FET 20 are cascade-connected to each other on a semiconductor substrate. In the first FET 10, a source finger electrode 11, a gate finger electrode 12, a drain finger electrode 13, and the gate finger electrode 12 are provided in this order from the left. The source finger electrodes 11 are connected to a first FET source bus line 16. The gate finger electrodes 12 are connected to a first FET gate bus line 17. The drain finger electrodes 13 are connected to a first FET drain bus line 18. Likewise, the second FET 20 includes source finger electrodes 21, gate finger electrodes 22, drain finger electrodes 23, a second FET source bus line 26, a second FET gate bus line 27, and a second FET drain bus line 28. The first FET source bus line 16 and the second FET drain bus line 28 are connected to each other with a connecting portion 34. In this manner, the source of the first FET 10 and the drain of the second FET 20 are cascade-connected to each other.

Figure 2:
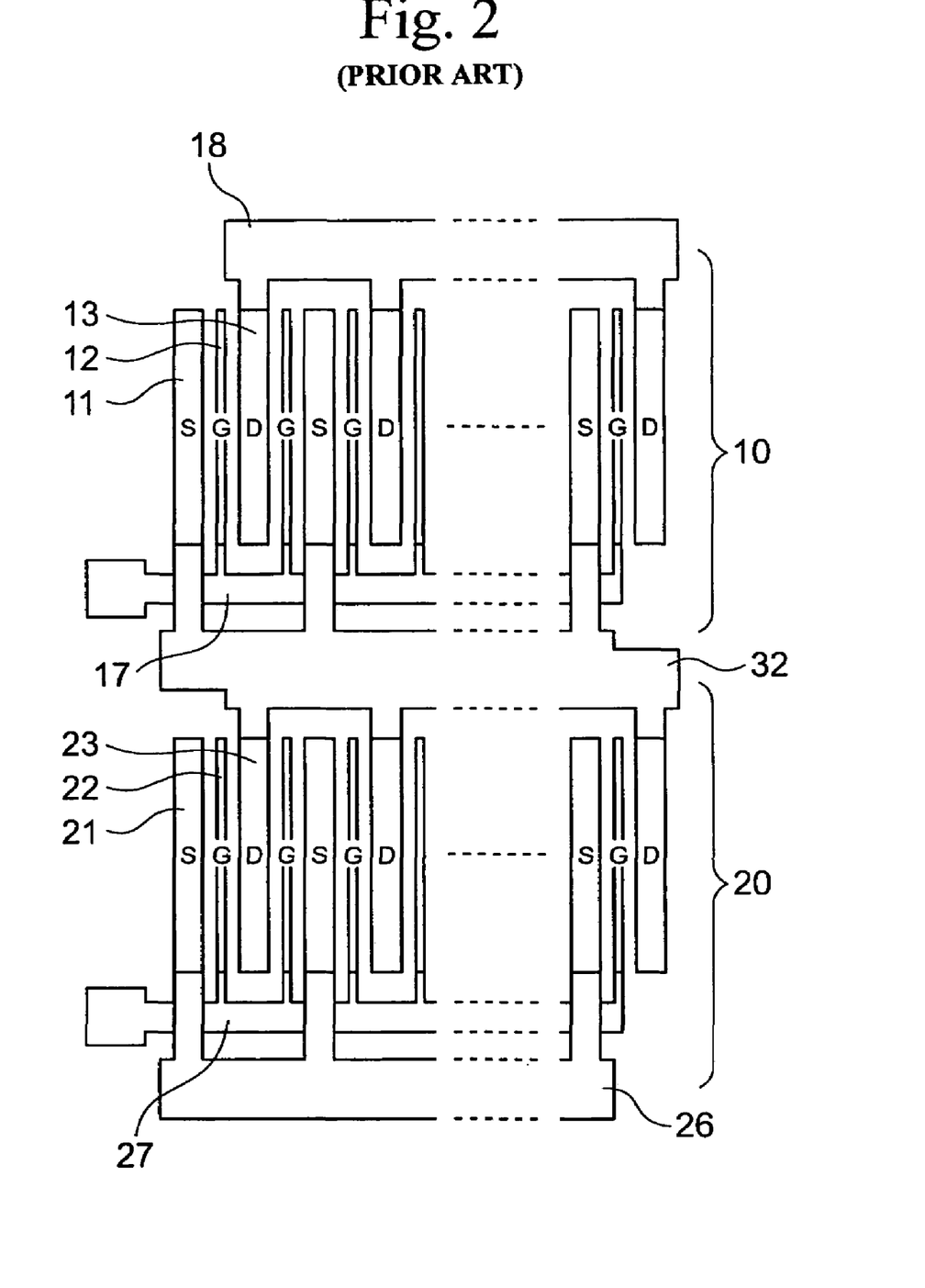
FIG. 2 is a plan view of another conventional semiconductor device.

FIG. 2 shows another example case where FETs are cascade-connected. In this example, the source finger electrodes 11 of the first FET 10 and the drain finger electrodes 23 of the second FET 20 are connected to a common bus line 32. The other aspects of the structure are the same as those of the structure shown in FIG. 1. As in this example, cascade-connected FETs may share a bus line.

In any case, the area of cascade-connected FETs is expected to be smaller.

SUMMARY OF THE INVENTION

It is therefore an object of the present invention to provide a semiconductor device and a method of manufacturing the semiconductor device in which the above disadvantage is eliminated.

A more specific object of the present invention is to provide a semiconductor device that has a smaller FET area, and a method of manufacturing such a semiconductor device.

According to an aspect of the present invention, there is provided a semiconductor device including: a first FET that is formed with a plurality of first unit FETs each having a first finger electrode and a second finger electrode provided on either side of a gate finger electrode, the first unit FETs being connected in parallel; and a second FET that is formed with a plurality of second unit FETs each having a first finger electrode and a second finger electrode provided on either side of a gate finger electrode, the second unit FETs being connected in parallel, the second finger electrode of each of the first unit FETs and the first finger electrode of each corresponding one of the second unit FETs forming a common finger electrode, the first finger electrodes of the first unit FETs, the second finger electrodes of the second unit FETs, and the common finger electrodes being arranged in a gate length direction of the first FET and the second FET. With this structure, the FET area can be reduced, as the finger electrodes of the first FET and the finger electrodes of the second FET are arranged in the gate length direction.

The semiconductor device may be configured so that: the first finger electrodes of the first FET are thicker on the side of a first bus line to which the first finger electrodes are connected; the second finger electrodes of the second FET are thicker on the side of a second bus line to which the second finger electrodes are connected; and the common finger electrodes are thicker on the side of a common bus line to which the common finger electrodes are connected. With this structure, the FET area can be made even smaller, as the finger electrodes are made thinner on the side where the smaller amount of current flows.

The semiconductor device may be configured so that the common bus line is provided on the opposite side from the first bus line and the second bus line, with respect to the first finger electrodes of the first FET, the second finger electrodes of the second FETs, and the common finger electrodes.

The semiconductor device may be configured so that the common finger electrodes serve as source finger electrodes of the first FET and drain finger electrodes of the second FET.

The semiconductor device may be configured so that the common finger electrodes serve as source finger electrodes of the first FET and the second FET, or as drain finger electrodes of the first FET and the second FET.

According to another aspect of the present invention, there is provided a method of manufacturing a semiconductor device that includes a first FET that is formed with a plurality of first unit FETs each having a first finger electrode and a second finger electrode provided on either side of a gate finger electrode, the first unit FETs being connected in parallel, and a second FET that is formed with a plurality of second unit FETs each having a first finger electrode and a second finger electrode provided on either side of a gate finger electrode, the second unit FETs being connected in parallel, the method comprising the steps of: forming the gate finger electrodes of the first FET and the gate finger electrodes of the second FET; forming the first finger electrodes and the second finger electrodes of the first FET, and the first finger electrodes and the second finger electrodes of the second FET, so that the second finger electrode of each of the first unit FETs and the first finger electrode of each of the second unit FETs form a common finger electrode, and that the first finger electrodes of the first FET, the second finger electrodes of the second FET, and the common finger electrodes are arranged in the gate length direction of the first FET and the second FET. With this structure, the FET area can be reduced, as the finger electrodes of the first FET and the finger electrodes of the second FET are arranged in the gate length direction.

The method may be configured so that: the first finger electrodes of the first FET are thicker on the side of a first bus line to which the first finger electrodes are connected; the second finger electrodes of the second FET are thicker on the side of a second bus line to which the second finger electrodes are connected; and the common finger electrodes are thicker on the side of a common bus line to which the common finger electrodes are connected. With this structure, the FET area can be made even smaller, as the finger electrodes are made thinner on the side where the smaller amount of current flows.

The method may be configured so as to further include the step of forming the common bus line, the first bus line, and the second bus line, so that the common bus line is provided on the opposite side from the first bus line and the second bus line, with respect to the first finger electrodes of the first FET, the second finger electrodes of the second FETs, and the common finger electrodes.

The method may be configured so that the common finger electrodes serve as source finger electrodes of the first FET and drain finger electrodes of the second FET.

The method may be configured so that the common finger electrodes serve as source finger electrodes of the first FET and the second FET, or as drain finger electrodes of the first FET and the second FET.

As described above, the present invention provides a semiconductor device that can have a smaller FET area, and a method of manufacturing such a semiconductor device.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

The following is a description of embodiments of the present invention, with reference to the accompanying drawings.

First Embodiment

A first embodiment of the present invention is an example of a horizontal FET that has the source of a first FET connected to the drain of a second FET. More specifically, the first finger electrodes of the first FET are drain finger electrodes 13, and the second finger electrodes of the first FET are common finger electrodes 30 that also serve as source finger electrodes. The first finger electrodes of the second FET are the common finger electrodes 30 that also serve as drain finger electrodes, and the second finger electrodes of the second FET are source finger electrodes 21.

Figure 3:
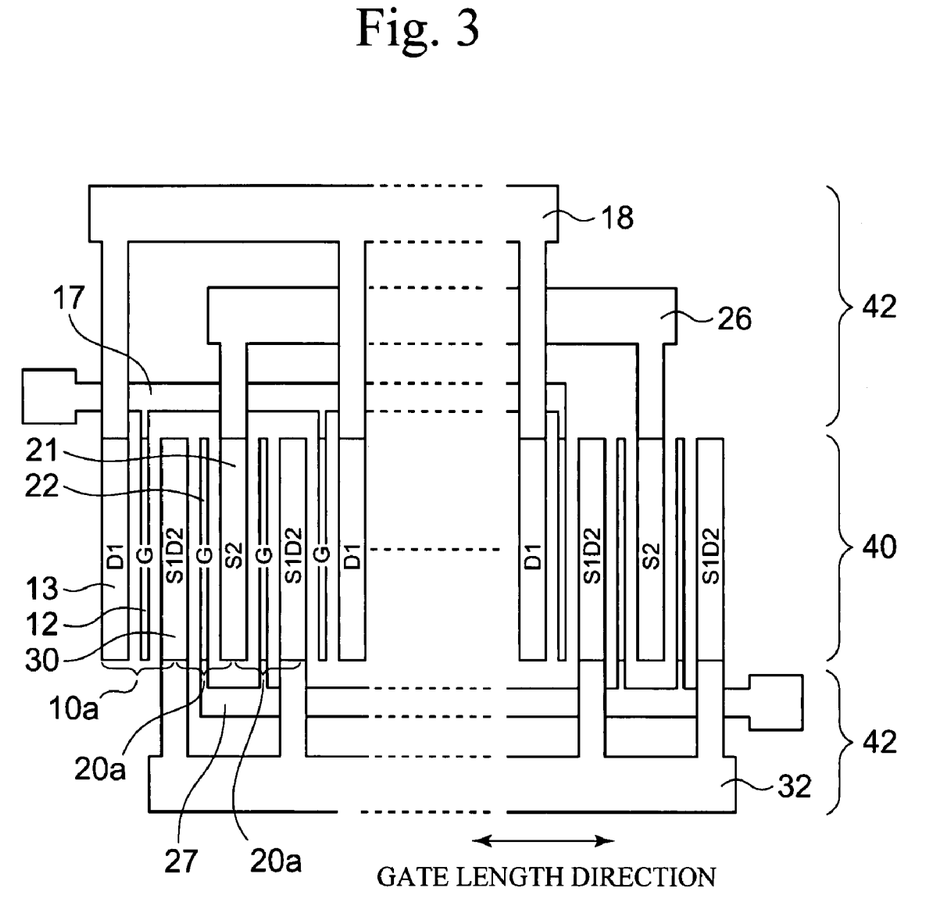
FIG. 3 is a plan view of a semiconductor device in accordance with a first embodiment of the present invention.

FIG. 3 is a plan view of the semiconductor device in accordance with the first embodiment. In a finger region 40 that is the active region of the semiconductor substrate, the drain finger electrode (D1) 13 of the first FET, the gate finger electrode 12 of the first FET, a common finger electrode (S1D2) 30 that serves as a source finger electrode of the first FET and a drain finger electrode of the second FET, the gate finger electrode 22 of the second FET, a source finger electrode (S2) 21 of the second FET, the gate finger electrode 22 of the second FET, and the common finger electrode (S1D2) 30 and the gate finger electrode 12 of the first FET are repeatedly provided in the gate length direction of the first FET and the second FET in this order from the left.

There are bus line regions 42 provided on either side of the finger region 40. One of the bus line regions 42 has the first FET drain bus line 18 (the first bus line) to which the drain finger electrodes 13 of the first FET are connected, the first FET gate bus line 17 to which the gate finger electrodes 12 of the first FET are connected, and the second FET source bus line 26 (the second bus line) to which the source finger electrodes 21 of the second FET are connected. The other one of the bus line regions 42 has the common bus line 32 to which the common finger electrodes 30 are connected, and the second FET gate bus line 27 to which the gate finger electrodes 22 of the second FET are connected. The bus lines 18, 26, and 32 extend in the gate length direction.

In the first embodiment, first unit FETs 10a that are connected in parallel constitute the first FET. Likewise, second unit FETs 20a are connected in parallel constitute the second FET. Each of the first unit FETs 10a includes the drain finger electrode 13 (a first finger electrode), the common finger electrode 30 as a source finger electrode (a second finger electrode), and the gate finger electrode 12 interposed between the drain finger electrode 13 and the common finger electrode 30. Likewise, each of the second unit FETs 20a includes the common finger electrode 30 as a drain finger electrode (a first finger electrode), the source finger electrode 21 (a second finger electrode), and the gate finger electrode 22 interposed between the common finger electrode 30 and the source finger electrode 21. Each of the source finger electrodes (the second finger electrodes) of the first unit FETs 10a and each corresponding one of the drain finger electrodes (the first finger electrodes) of the second unit FETs 20a constitute the common finger electrode 30. The drain finger electrodes 13 of the first FET, the source finger electrodes 21 of the second FET, and the common finger electrodes 30 are arranged in the gate direction of the first FET and the second FET. In this structure, the first unit FETs 10a and the second unit FETs 20a are arranged in the gate length direction. The first unit FETs 10a and the second unit FETs 20a are cascade-connected with the common finger electrodes 30, and the cascade-connected first unit FETs 10a and the second unit FETs 20a are arranged in the gate length direction. In this manner, the fingers of the first FET and the second FET are contained in the single finger region 40, so that the FET area can be reduced.

Figure 4A:
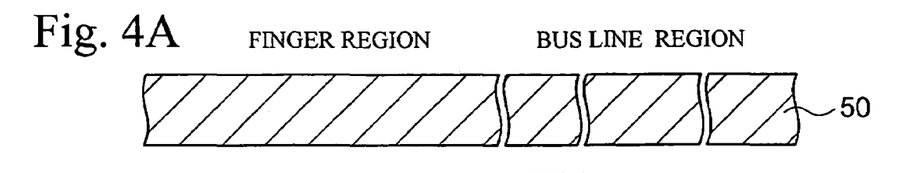
FIGS. 4A through 4D are cross-sectional views illustrating a method of manufacturing the semiconductor device in accordance with the first embodiment.
Figure 4B:
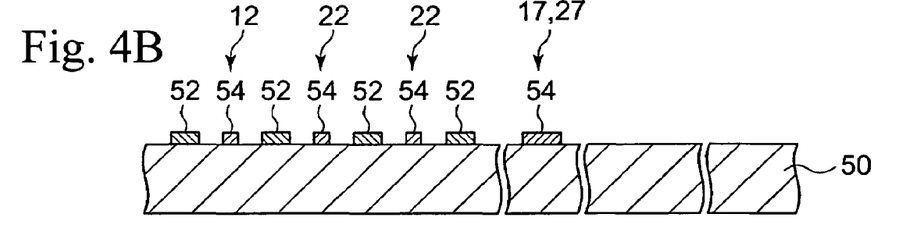

FIGS. 4A through 4D are cross-sectional views illustrating a method of manufacturing the semiconductor device in accordance with the first embodiment (cross-sectional views of the finger portion 40 and each bus line, taken in the gate length direction). As shown in FIG. 4A, a GaN (gallium nitride) electron transit layer, an AlGaN (aluminum gallium nitride) electron supply layer, and a GaN cap layer are stacked in this order on an $Al_2O_3$ (sapphire) substrate. In FIGS. 4A through 4D, the substrate having those layers stacked thereon is shown as a substrate 50. As shown in FIG. 4B, Ti/Al films are formed as ohmic electrodes 52 on the substrate 50. Also, Ni/Au films are formed as gate electrodes 54 on the substrate 50. In the finger region 40, the gate electrodes 54 form the gate finger electrodes 12 and 22 of the first FET and the second FET. In the bus line region 42, the gate electrodes 54 form the first FET gate bus line 17 and the second FET gate bus line 27 that are connected to the gate finger electrodes 12 and 22, respectively.

Figure 4C:
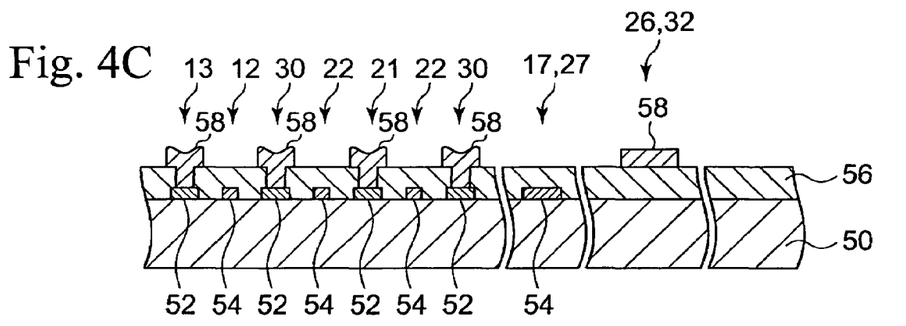

As shown in FIG. 4C, an interlayer insulating film 56 is formed on the substrate 50. Wiring layers 58 made of Au film, for example, are formed on the interlayer insulating film 56. In the finger region 40, the ohmic electrodes 52 and the wiring layers 58 form the drain finger electrodes 13 of the first FET, the common finger electrodes 30, and the source finger electrodes 21 of the second FET. Accordingly, the drain finger electrode 13 of the first FET, the common finger electrode 30, the source finger electrode 21 of the second FET, and the common finger electrode 30 are repeatedly provided in the gate length direction in this order. In the bus line region 42, the second FET source bus line 26 and the common bus line 32 are formed with the wiring layers 58.

Figure 4D:
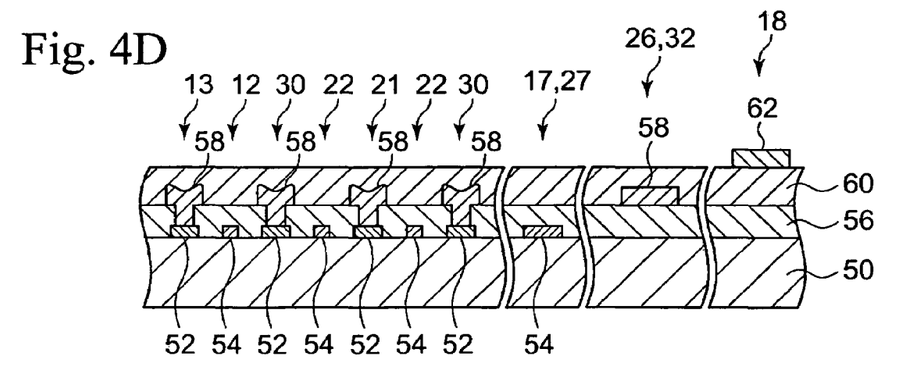

As shown in FIG. 4D, an interlayer insulating film 60 is formed on the interlayer insulating film 56. A wiring layer 62 made of Au film, for example, is formed on the interlayer insulating film 60. In the bus line region 42, the wiring layer 62 forms the first FET drain bus line 18. The first FET drain finger electrodes 13 are connected to the first FET drain bus line 18 via contact holes (not shown) that are formed in the interlayer insulating film 60. Accordingly, the first FET drain bus line 18 and the second FET source bus line 26 are formed on the same side of the finger region 40, and the common bus line 32 is formed on the opposite side of the finger region 40 from the first FET drain bus line 18 and the second FET source bus line 26. In this manner, the semiconductor device in accordance with the first embodiment is completed.

Although the FETs shown in FIGS. 4A through 4D are formed with a GaN layer and an AlGaN layer, the FETs may be formed on a GaAs substrate, on a Si substrate, or on a SiC substrate. In the first embodiment, the length of each finger electrode in the gate width direction is approximately 200 μm, the width of each of the source finger electrodes 21 and 30 and the drain finger electrodes 13 and 30 in the gate length direction is approximately 10 μm, the width (the gate length) of each of the gate finger electrodes 12 and 22 in the gate length direction is 2 μm, the distance between each one of the source finger electrodes 21 and 30 and each corresponding one of the gate finger electrodes 22 and 12 is 5 μm, and the distance between each one of the drain finger electrodes 13 and 30 and each corresponding one of the gate finger electrodes 12 and 22 is 10 μm. However, those sizes may be arbitrarily changed in accordance with the purpose of use.

Figure 5:
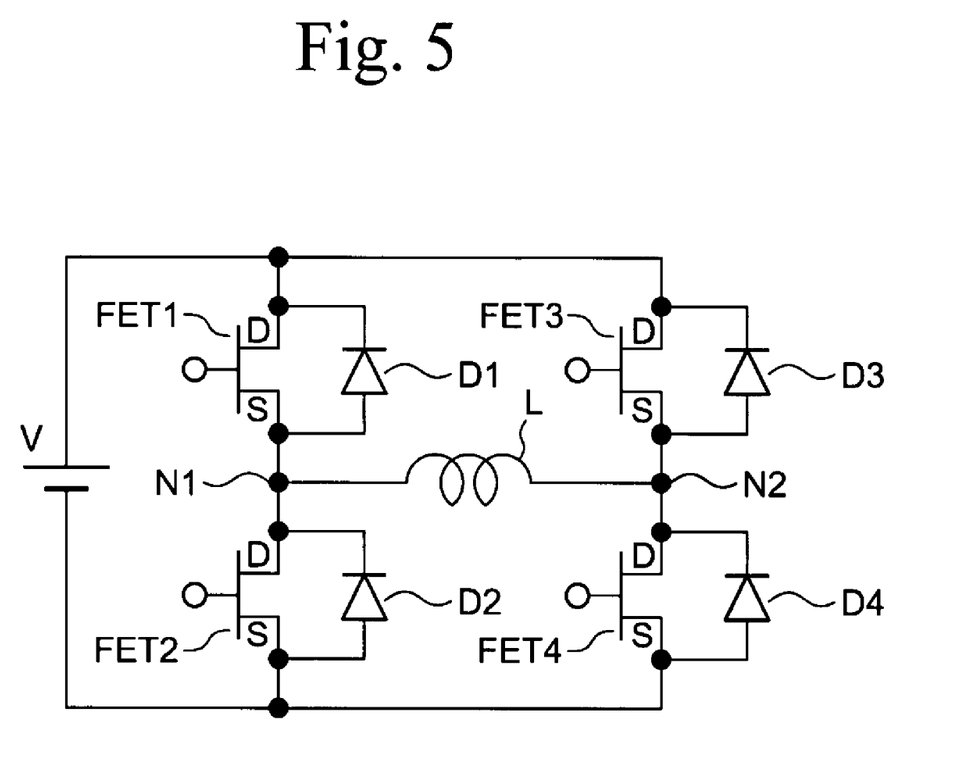
FIG. 5 is a circuit diagram showing an inverter circuit to which the first embodiment is applied.

FIG. 5 shows an example of an inverter circuit to which the first embodiment is applied. The inverter circuit includes FETs 1 through 4, and diodes D1 through D4. The source S of the FET 1 is connected to the drain D of the FET 2 with a node N1. Accordingly, the FET 1 and the FET 2 are cascade-connected to each other. The first embodiment can be applied to the cascade-connected FET 1 and FET 2. Likewise, the first embodiment can be applied to the FET 3 and the FET 4 that are cascade-connected to each other. In the example structure shown in FIG. 5, the FET 1 and the FET 4, and the FET 2 and the FET 3 are alternately switched. In this manner, a direct-current voltage V applied to the cascade-connected FET 1 and FET 2 and the cascade-connected FET 3 and FET 4 can be converted into an alternating-current voltage to be applied to the node N1 and the node N2 on either side of a load L. The first embodiment may be applied not only to the above inverter circuit, but also to a circuit in which the source S of the first FET is cascade-connected to the drain D of the second FET.

Second Embodiment

A second embodiment of the present invention is an example of a horizontal FET that has the sources of the first FET connected to the sources of the second FET. More specifically, the first finger electrodes of the first FET are drain finger electrodes 13, and the second finger electrodes of the first FET are common finger electrodes 31 that also serve as source finger electrodes. The first finger electrodes of the second FET are the common finger electrodes 31 that also serve as source finger electrodes, and the second finger electrodes of the second FET are drain finger electrodes 23.

Figure 6:
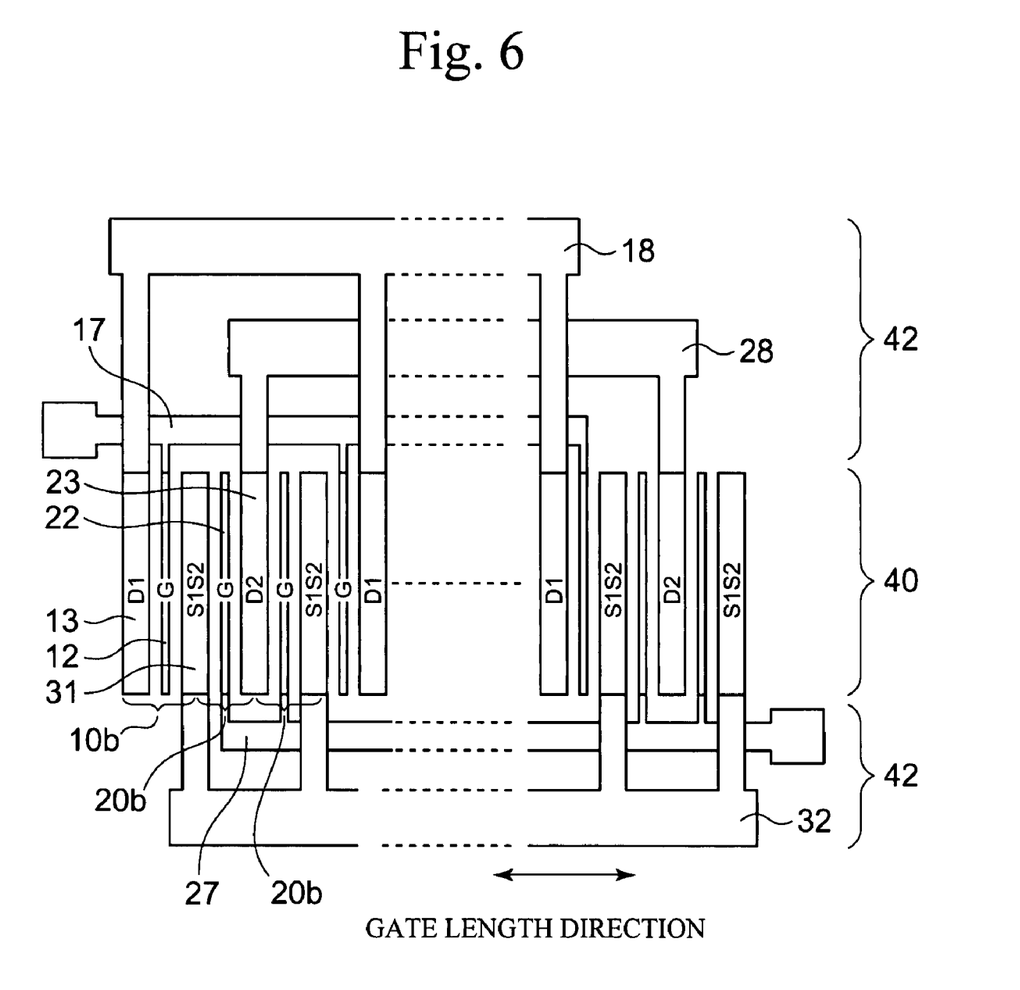
FIG. 6 is a plan view of a semiconductor device in accordance with a second embodiment of the present invention.

FIG. 6 is a plan view of the semiconductor device in accordance with the second embodiment. In the finger region 40 that is the active region of the semiconductor substrate, the drain finger electrode (D1) 13 of the first FET, the gate finger electrode 12 of the first FET, a common finger electrode (S1S2) 31 that serves as a source finger electrode of the first FET and a source finger electrode of the second FET, the gate finger electrode 22 of the second FET, a drain finger electrode (D2) 23 of the second FET, the gate finger electrode 22 of the second FET, and the common finger electrode (S1S2) 31, and the gate finger electrode 12 of the first FET are repeatedly provided in the gate length direction of the first FET and the second FET in this order from the left.

There are bus line regions 42 provided on either side of the finger region 40. One of the bus line regions 42 has the first FET drain bus line 18 (the first bus line) to which the drain finger electrodes 13 of the first FET are connected, the first FET gate bus line 17 to which the gate finger electrodes 12 of the first FET are connected, and the second FET drain bus line 28 (the second bus line) to which the drain finger electrodes 23 of the second FET are connected. The other one of the bus line regions 42 has the common bus line 32 to which the common finger electrodes 31 are connected, and the second FET gate bus line 27 to which the gate finger electrodes 22 of the second FET are connected.

In the second embodiment, each first unit FET 10b includes the drain finger electrode 13 of the first FET and the common finger electrode 31 that are provided in the gate direction. Each second unit FET 20b includes the common finger electrode 31 and the drain finger electrode 23 of the second FET. In this structure, the first unit FETs 10b and the second unit FETs 20b are arranged in the gate length direction. Accordingly, the fingers of the first FET and the second FET can be formed in the single finger region 40, as in the first embodiment. Thus, the FET area can be reduced.

The method of manufacturing the semiconductor device in accordance with the second embodiment is the same as the method in accordance with the first embodiment illustrated in FIGS. 4A through 4D, except for the procedure shown in FIG. 4C. In the procedure equivalent to the procedure shown in FIG. 4C, the drain finger electrode 13 of the first FET, the common finger electrode 31, the drain finger electrode 23 of the second FET, and the common finger electrode 31 are repeatedly provided in the gate length direction in this order. In the bus line region 42, the second FET drain bus line 28 and the common bus line 32 are formed. The other aspects are the same as those in the first embodiment, and therefore, explanation of them is omitted herein.

Figure 7:
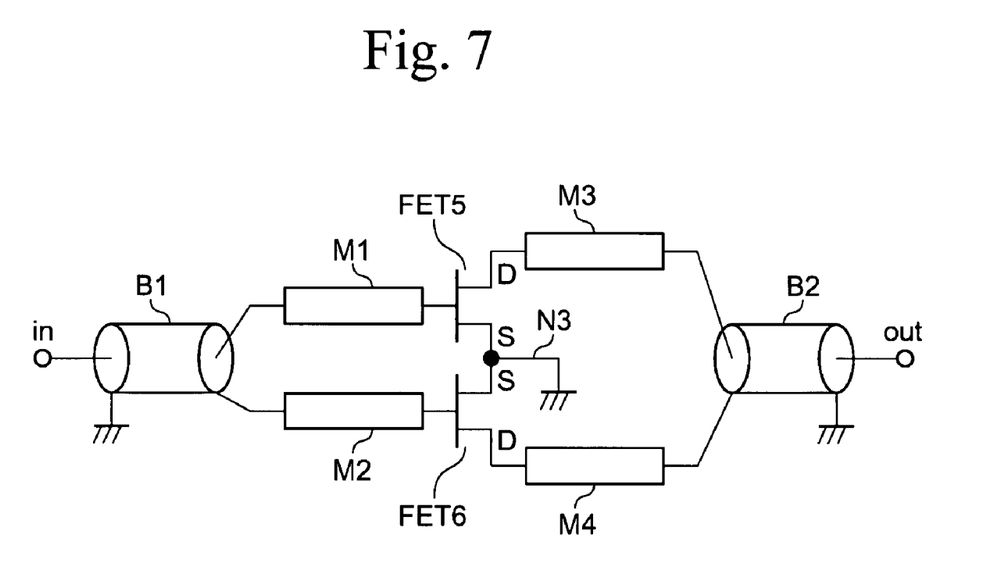
FIG. 7 is a circuit diagram showing a push-pull circuit to which the second embodiment is applied.

FIG. 7 shows an example of a push-pull circuit to which the second embodiment is applied. The push-pull circuit includes a FET 5, a FET 6, matching circuits M1 through M4, and baluns B1 and B2. The source S of the FET 5 is connected to the source S of the FET 6 with a node N3. Accordingly, the FET 5 and the FET 6 are cascade-connected to each other. The second embodiment can be applied to the FET 5 and the FET 6 that are cascade-connected to each other. In the example structure shown in FIG. 7, an input high-frequency signal is divided into two signals of opposite phases by the balun B1. The two signals are input to the gates of the FET 5 and the FET 6 via the matching circuits M1 and M2, respectively. The signals amplified by the FET 5 and the FET 6 are combined by the balun B2 via the matching circuits M3 and M4. The combined high-frequency signal is output. The second embodiment may be applied not only to a push-pull circuit, but also to a circuit that has the source of the first FET cascade-connected to the source of the second FET.

Third Embodiment

Figure 8:
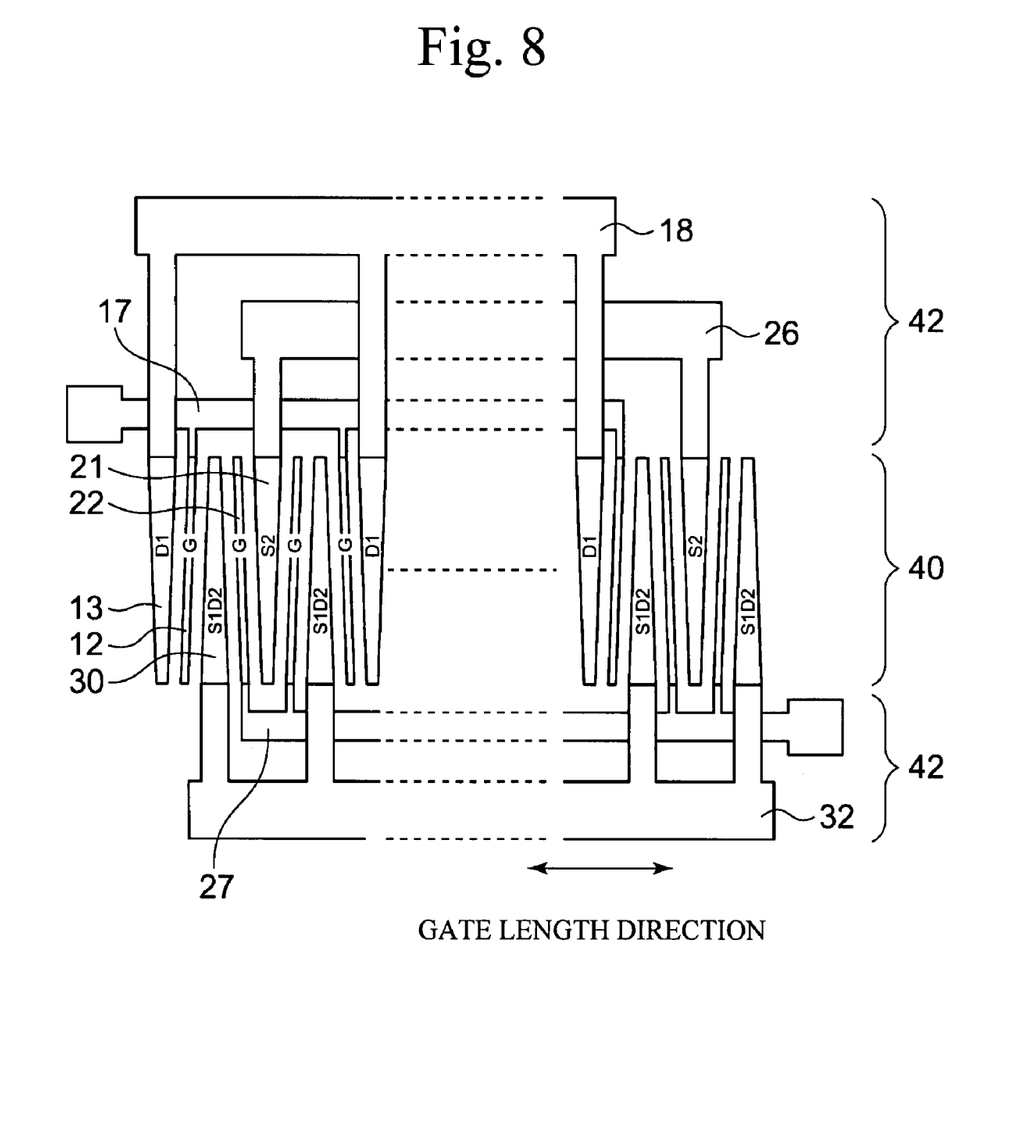
FIG. 8 is a plan view of a semiconductor device in accordance with a third embodiment of the present invention.

Referring now to FIG. 8, a semiconductor device in accordance with a third embodiment of the present invention is described. In this semiconductor device, the drain finger electrodes 13 of the first FET are thicker on the side of the first FET drain bus line 18, and are thinner as they are further away from the first FET drain bus line 18. Likewise, the source finger electrodes 21 of the second FET are thicker on the side of the second FET source bus line 26, and the common finger electrodes 30 are thicker on the side of the common bus line 32. The other aspects of the structure are the same as those of the first embodiment. The same components as those of the first embodiment are denoted by the same reference numerals as those used in the first embodiment, and explanation of them is omitted herein.

A method of manufacturing the semiconductor device in accordance with the third embodiment is the same as that of the first embodiment, except that, in the procedures equivalent to the procedures shown in FIGS. 4A through 4D, the drain finger electrodes 13 of the first FET are made thicker on the side of the first FET drain bus line 18, the source finger electrodes 21 of the second FET are made thicker on the side of the second FET source bus line 26, and the common finger electrodes 30 are made thicker on the side of the common bus line 32, as shown in FIG. 8. The other aspects of the manufacturing method are the same as those of the first embodiment, and explanation of them is omitted herein.

In accordance with the third embodiment, each of the finger electrodes 13, 21, and 30 is wider on the current supply side (the side on which the larger amount of current flows) in the gate length direction, and each of the finger electrodes 13, 21, and 30 is thinner on the opposite side from each corresponding one of the bus lines 18, 26, and 32 (the side on which the smaller amount of current flows). In a case where the thicknesses (the widths in the gate length direction) of the finger electrodes 13, 21, and 30 are the same in the bus line direction, the thickness of each of the finger electrodes 13, 21, and 30 is determined at the location where the highest current density is observed. In accordance with the third embodiment, each of the finger electrodes 13, 21, and 30 can be made thin on the side where the amount of current is smaller. Accordingly, the FET area can be reduced.

Also, in the third embodiment, the first FET drain bus line 18 and the second FET source bus line 26 are provided on the opposite side of the finger region 40 from the common bus line 32. Accordingly, the first FET drain finger electrodes 13 and the second FET source finger electrodes 21 that are thinner on the side of the common bus line 32 and the common finger electrodes 30 that are thicker on the side of the common bus line 32 are alternately provided. Accordingly, the FET area can be further reduced. In the third embodiment, the largest possible thickness of each of the finger electrodes 21, 13, and 30 is approximately 20 µm, and the smallest width is approximately 5 µm. However, those sizes may be arbitrarily changed.

Fourth Embodiment

Figure 9:
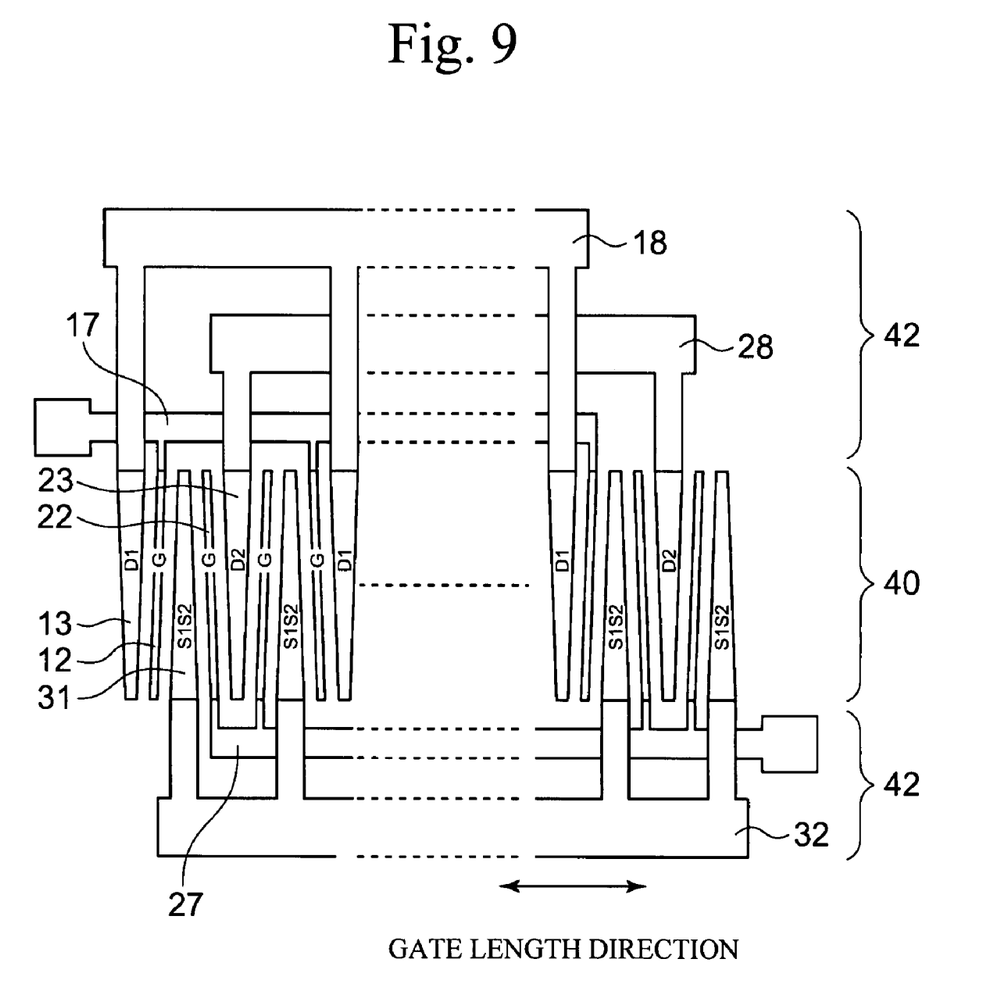
FIG. 9 is a plan view of a semiconductor device in accordance with a fourth embodiment of the present invention.

Referring now to FIG. 9, a semiconductor device in accordance with a fourth embodiment of the present invention is described. The semiconductor device of this embodiment is the same as the semiconductor device of the third embodiment shown in FIG. 8, except that the source finger electrodes 21 of the second FET are replaced with drain finger electrodes 23 of the second FET, the second FET source bus line 26 is replaced with the second FET drain bus line 28 (the second bus line), and the common finger electrodes 30 that serve as the source finger electrodes of the first FET and the drain finger electrodes of the second FET are replaced with common finger electrodes 31 that serve as the source finger electrodes of the first FET and the source finger electrodes of the second FET. The other aspects of the structure are the same as those of the third embodiment. The same components as those of the third embodiment are denoted by the same reference numerals as those used in the third embodiment, and explanation of them is omitted herein. Also, the method of manufacturing the semiconductor device in accordance with the fourth embodiment is the same as the manufacturing method in accordance with the third embodiment, except for the above described replacements, and explanation of it is omitted herein. As in the third embodiment, the FET area can also be reduced in the fourth embodiment.

In the first embodiment and the third embodiment, the common finger electrodes 30 serve as the source finger electrodes of the first FET and the drain finger electrodes of the second FET. However, the common finger electrodes 30 may serve as the drain finger electrodes of the first FET and the source finger electrodes of the second FET. In the second embodiment and the fourth embodiment, the common finger electrodes 31 serve as the source finger electrodes of the first FET and the source finger electrodes of the second FET. However, the common finger electrode 31 may serve as the drain finger electrodes of the first FET and the drain finger electrodes of the second FET.

In the first through fourth embodiments, other than the FET area reducing effect, the following effects can be achieved. In any FET in accordance with the first through fourth embodiments, the first FET and the second FET are cascade-connected to each other in the shorter direction of the common finger electrodes 30 or 31. In the conventional structures shown in FIGS. 1 and 2, the first FET and the second FET are connected to each other outside the finger region 40. Accordingly, the current flowing between the first FET and the second FET flows in the longitudinal direction of the finger electrodes. In the first through fourth embodiments, on the other hand, the current flowing between the first FET and the second FET does not pass through the outside of the finger region 40. Accordingly, the amount of current flowing in the longitudinal direction of the finger electrodes can be reduced. Further, since the first FET and the second FET are formed with the first unit FETs 10a and the second unit FETs 20a, respectively, the amount of current flowing in the longitudinal direction of the finger electrodes can be further reduced. The current flowing in the longitudinal direction of the finger electrodes generates resistance or inductance components that are unnecessary for FET operations. In the first through fourth embodiments, however, those unnecessary components can be effectively reduced.

Although a few preferred embodiments of the present invention have been shown and described, it would be appreciated by those skilled in the art that changes may be made in these embodiments without departing from the principles and spirit of the invention, the scope of which is defined in the claims and their equivalents.

The present application is based on Japanese Patent Application No. 2006-101123 filed Mar. 31, 2006, the entire disclosure of which is hereby incorporated by reference.

What is claimed is:

1. A method of manufacturing a semiconductor device that includes a first FET that is formed with a plurality of first unit FETs each having a first finger electrode and a second finger electrode provided on either side of a gate finger electrode, the first unit FETs being connected in parallel, and a second FET that is formed with a plurality of second unit FETs each having a first finger electrode and a second finger electrode provided on either side of a gate finger electrode, the second unit FETs being connected in parallel, the method comprising the steps of:

forming the gate finger electrodes of the first FET and the gate finger electrodes of the second FET;

forming the first finger electrodes and the second finger electrodes of the first FET, and the first finger electrodes and the second finger electrodes of the second FET, so that the second finger electrode of each of the first unit FETs and the first finger electrode of each of the second unit FETs form a common finger electrode, and that the first finger electrodes of the first FET, the second finger electrodes of the second FET, and the common finger electrodes are arranged in the gate length direction of the first FET and the second FET.

2. The method as claimed in claim 1, wherein:

the first finger electrodes of the first FET are thicker on the side of a first bus line to which the first finger electrodes are connected;

the second finger electrodes of the second FET are thicker on the side of a second bus line to which the second finger electrodes are connected; and the common finger electrodes are thicker on the side of a common bus line to which the common finger electrodes are connected.

3. The method as claimed in claim 2, further comprising the step of forming the common bus line, the first bus line, and the second bus line, so that the common bus line is provided on the opposite side from the first bus line and the second bus line, with respect to the first finger electrodes of the first FET, the second finger electrodes of the second FETs, and the common finger electrodes.

4. The method as claimed in claim 1, wherein the common finger electrodes serve as source finger electrodes of the first FET and drain finger electrodes of the second FET.

5. The method as claimed in claim 1, wherein the common finger electrodes serve as source finger electrodes of the first FET and the second FET, or as drain finger electrodes of the first FET and the second FET.

6. A semiconductor device comprising:

a first FET that is formed with a plurality of first unit FETs each having a first finger electrode and a second finger electrode provided on either side of a gate finger electrode, the first unit FETs being connected in parallel; and a second FET that is formed with a plurality of second unit FETs each having a first finger electrode and a second finger electrode provided on either side of a gate finger electrode, the second unit FETs being connected in parallel, the second finger electrode of each of the first unit FETs and the first finger electrode of each corresponding one of the second unit FETs forming a common finger electrode, the first finger electrodes of the first unit FETs, the second finger electrodes of the second unit FETs, and the common finger electrodes being arranged in a gate length direction of the first FET and the second FET.

7. The semiconductor device as claimed in claim 6, wherein:

the first finger electrodes of the first FET are thicker on the side of a first bus line to which the first finger electrodes are connected;

the second finger electrodes of the second FET are thicker on the side of a second bus line to which the second finger electrodes are connected; and the common finger electrodes are thicker on the side of a common bus line to which the common finger electrodes are connected.

8. The semiconductor device as claimed in claim 7, wherein the common bus line is provided on the opposite side from the first bus line and the second bus line, with respect to the first finger electrodes of the first FET, the second finger electrodes of the second FETs, and the common finger electrodes.

9. The semiconductor device as claimed in claim 6, wherein the common finger electrodes serve as source finger electrodes of the first FET and drain finger electrodes of the second FET.

10. The semiconductor device as claimed in claim 6, wherein the common finger electrodes serve as source finger electrodes of the first FET and the second FET, or as drain finger electrodes of the first FET and the second FET.

* * * * *